United States Patent
Matsui (10) Patent No.: US 7,978,557 B2
(45) Date of Patent: Jul. 12, 2011

(54) SEMICONDUCTOR MEMORY DEVICE AND DATA PROCESSING SYSTEM INCLUDING THE SEMICONDUCTOR MEMORY DEVICE

(75) Inventor: Yoshinori Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 362 days.

(21) Appl. No.: 12/318,731

(22) Filed: Jan. 7, 2009

(65) Prior Publication Data
US 2009/0182914 A1    Jul. 16, 2009

(30) Foreign Application Priority Data

Jan. 11, 2008  (JP) ............................... P2008-004304

(51) Int. Cl.
*G11C 7/00* (2006.01)
(52) U.S. Cl. .................... 365/221; 365/230.05; 365/233
(58) Field of Classification Search .................. 365/221, 365/230.05, 233, 230.03
See application file for complete search history.

(56) References Cited

U.S. PATENT DOCUMENTS 5,566,124 A * 10/1996 Fudeyasu et al. ......... 365/230.06
5,566,371 A * 10/1996 Ogawa .................... 365/230.03
2006/0161338 A1   7/2006 Sohn et al.
2006/0236041 A1  10/2006 Sohn et al.
2007/0022245 A1   1/2007 Sohn et al.

FOREIGN PATENT DOCUMENTS

JP          2007-35039         2/2007

OTHER PUBLICATIONS

"A 512Mb 2-Channel Mobile DRAM (OneDRAM) with Shared Memory Arrary" Kyung woo Nam, IEEE Asisan Solid-State Circuits Conference, Korea, Nov. 12-14, 2007, pp. 204-207.

* cited by examiner

*Primary Examiner* — Son T Dinh
(74) *Attorney, Agent, or Firm* — McGinn IP Law Group, PLLC (57) ABSTRACT

A semiconductor device that includes a plurality of memory cell arrays, a plurality of ports, a plurality of internal address generating circuits, and a controller. The plurality of internal address generating circuits may generate first and second internal addresses of first and second memory cell arrays of the plurality of memory cell arrays. The first internal address may designate a first area of the first memory cell array. The second internal address may designate a second area of the second memory cell array. The controller reads a series of data from the first area sequentially and writes the series of read data into the second area sequentially without transferring the series of read data to the plurality of ports.

20 Claims, 7 Drawing Sheets

SEMICONDUCTOR MEMORY DEVICE AND DATA PROCESSING SYSTEM INCLUDING THE SEMICONDUCTOR MEMORY DEVICE

BACKGROUND OF THE INVENTION

1. Field of the Invention

The present invention generally relates to a semiconductor memory device and a data processing system including the semiconductor memory device. More specifically, the present invention relates to a semiconductor memory device that includes a plurality of ports connected to a plurality of processors, shared memory region and dedicated memory region, wherein the shared memory region and the dedicated memory region are accessible by the plurality of processors, as well as to a data processing system including the semiconductor memory device.

Priority is claimed on Japanese Patent Application No. 2008-4304, filed Jan. 11, 2008, the content of which is incorporated herein by reference.

2. Description of the Related Art

In recent years, data processing systems to be devices such as terminal devices and mobile phones may often include a dynamic random access memory (DRAM). The dynamic random access memory can be used to transfer data between an application processor and a baseband processor. The application processor can be used to execute applications such as e-mail editor and Web-browser. The baseband processor can be used to execute the processing necessary for talking and communication.

The United States Patent Applications, First Publications, Nos. 2006/0161338 and 2006/0236041 and Japanese Unexamined Patent Application, First Publication No. 2007-35039 as well as Kyung woo Nam, et al, "A 512 Mb 2-Channel Mobile DRAM (OneDRAM™) with Shared Memory Array", IEEE Asian Solid-State Circuits Conference, Korea, Nov. 12-14, 2007, 7-1, pp. 204-207, each disclose a multi-port DRAM. In general, the multi-port DRAM can perform high speed data transfer between the application processor and the baseband processor at a higher speed than when using a bus in the data processing system for the data transfer. Use of the multi-port DRAM can reduce the number of the necessary parts for the data transfer.

SUMMARY

In one embodiment, a semiconductor device that may includes, but is not limited to, a plurality of memory cell arrays, a plurality of ports, a plurality of internal address generating circuits, and a controller. The plurality of internal address generating circuits may generate first and second internal addresses of first and second memory cell arrays of the plurality of memory cell arrays. The first internal address may designate a first area of the first memory cell array. The second internal address may designate a second area of the second memory cell array. The controller reads a series of data from the first area sequentially and writes the series of read data into the second area sequentially without transferring the series of read data to the plurality of ports.

In another embodiment, a semiconductor device that may includes, but is not limited to, a plurality of memory cell arrays, a plurality of ports, a plurality of internal address generating circuits, and a controller. The plurality of internal address generating circuits may generate first and second internal addresses of first and second memory cell arrays of the plurality of memory cell arrays. The first internal address may designate a first area of the first memory cell array. The second internal address may designate a second area of the second memory cell array. The controller performs parallel reading and writing operations of reading a series of data from the first area sequentially and writing the series of read data into the second area sequentially. The controller starts the operation of writing the series of read data into the second area before the controller completes the operation of reading the series of data from the first area.

In still another embodiment, a data processing system that may includes, but is not limited to, a plurality of memory cell arrays, a plurality of ports, a plurality of processors being each coupled to a corresponding one of the plurality of ports, a plurality of internal address generating circuits, and a controller. The plurality of internal address generating circuits may receive a data transfer command including an address signal through the port from the processor. The internal address generating circuit may generate first and second internal addresses of first and second memory cell arrays of the plurality of memory cell arrays. The first internal address may designate a first area of the first memory cell array. The second internal address may designate a second area of the second memory cell array. The controller may read a series of data from the first area sequentially and write the series of read data into the second area sequentially in accordance with the data transfer command, without transferring the series of read data to the plurality of ports. The controller may start the operation of writing the series of read data into the second area before the controller completes the operation of reading the series of data from the first area.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 5, 6 and 7, in order to facilitate the understanding of the present invention.

In general, the multi-port DRAM has a plurality of ports which each have the same input and output as the general DRAM so as to allow an access to the multi-port DRAM by using the same protocol as the general DRAM. The protocol for memory control that can be used for the general DRAM can also be available for the multi-port DRAM.

In general, the multi-port DRAM includes a plurality of memory cell arrays. The plurality of memory cell arrays includes a plurality of dedicated memory cell arrays and at least one, typically one shared memory cell array. The plurality of dedicated memory cell arrays may be allocated to a plurality of ports. Every dedicated memory cell array may be allocated to one of the ports. Every port is allocated to a processor. Every port is connected to a processor. Every port can be allocated with at least one dedicated memory cell array that is accessible only from this port, but is inaccessible from any other port. The shared memory cell array can be allocated commonly to the plurality of ports. The plurality of ports can be allocated with the shared memory cell array. The shared memory cell array is accessible from every port. The shared memory cell array can typically be used as a data transfer area to transfer data.

In some cases, the multi-port DRAM may include, but is not limited to, an A-port and a B-port. In this case, the A-port can be allocated with at least one dedicated memory cell array, while the B-port can be allocated with the remaining dedicated memory cell array or arrays. The A-port and the B-port can be allocated commonly with the shared memory cell array.

The multi-port DRAM may transfer from the shared memory cell array to one or more dedicated memory cell arrays. Each processor transfers data from the shared memory cell array to a dedicated memory cell array. This dedicated memory cell array is dedicated to a port, to which this processor is connected. This processor performs data-processing after the data is transferred from the shared memory cell array to this dedicated memory cell array. This allows any other processor to transfer other data to the shared memory cell array, while this processor performs the data-processing.

Figure 5:
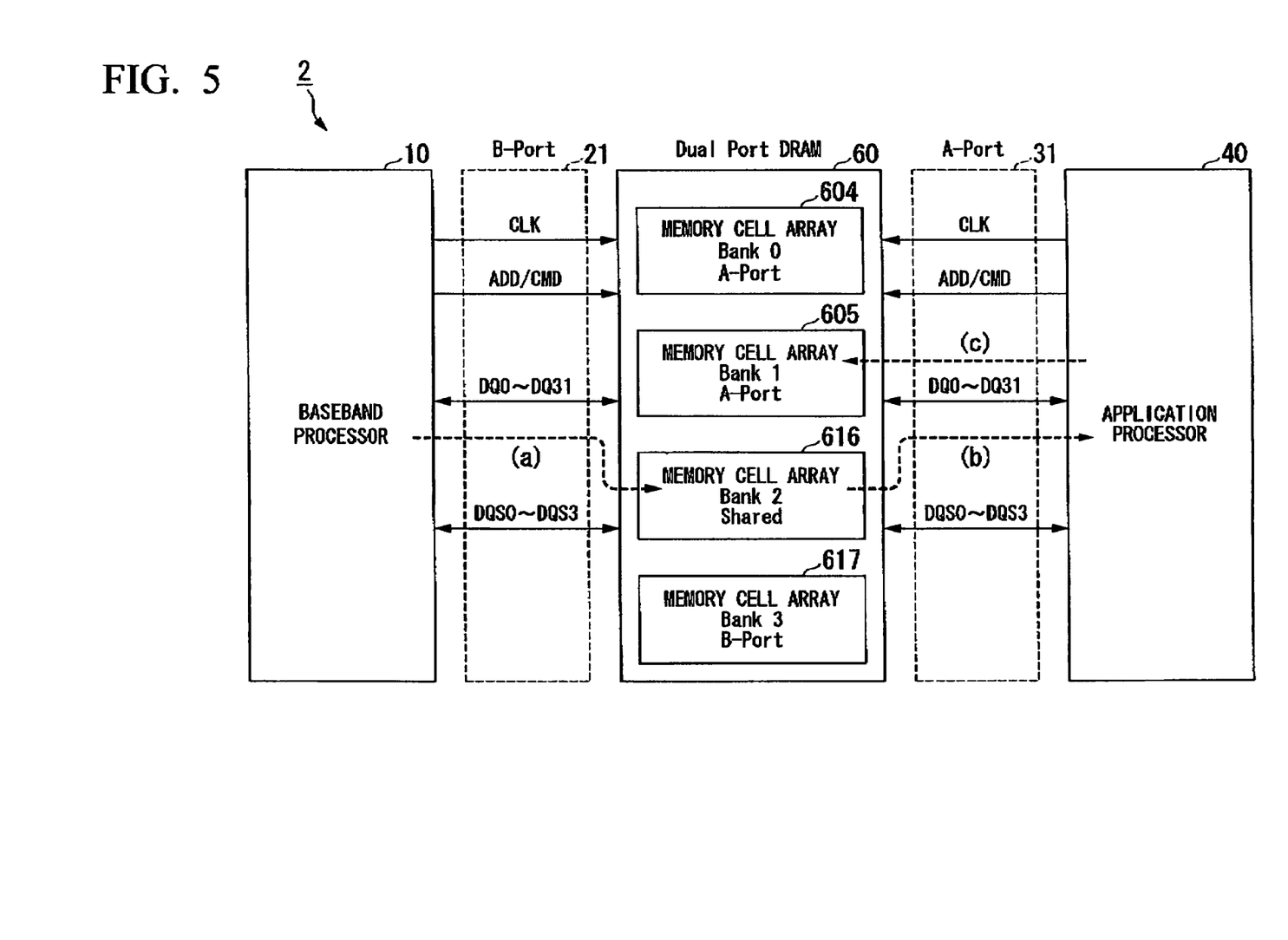
FIG. 5 is a schematic block diagram illustrating a data processing system that includes a dual port DRAM, a baseband processor and an application processor in accordance with the related art.

FIG. 5 is a schematic block diagram illustrating a data processing system 2 that includes a dual port DRAM 60, a baseband processor 10 and an application processor 40 in accordance with the related art The dual port DRAM 60 performs as a multi-port DRAM. The dual port DRAM 60 has two ports, for example, an A-port and a B-port. The dual port DRAM 60 is connected through a B-port bus 21 to the baseband processor 10. The dual port DRAM 60 is connected through an A-port bus 31 to the application processor 40. The A-port bus 31 connects between the dual port DRAM 60 and the application processor 40. The B-port bus 21 connects between the dual port DRAM 60 and the baseband processor 10.

The dual port DRAM 60 may include, but is not limited to, A-port-dedicated memory cell arrays 604 and 605, a shared memory cell array 616, and a B-port-dedicated memory cell array 617.

In this data processing system 2, the baseband processor 10 can transfer data to the application processor 40 as follows.

In the step (a), the baseband processor 10 transfers data through the B-port bus 21 the shared memory cell array 616 in the dual port DRAM 60. The shared memory cell array 616 stores the data.

In the step (b), the application processor 40 reads the stored data out of the shared memory cell array 616 through the A-port bus 31.

In the step (c), the application processor 40 transfers the read data through the A-port bus 31 to the A-port-dedicated memory cell array 605 that is dedicated to the A-port bus 31. The A-port-dedicated memory cell array 605 stores the data.

The data transfer from the baseband processor 10 to the application processor 40 is performed as described above, so that the data is temporary stored in the shared memory cell array 616 and then stored in the A-port-dedicated memory cell array 605.

Figure 6:
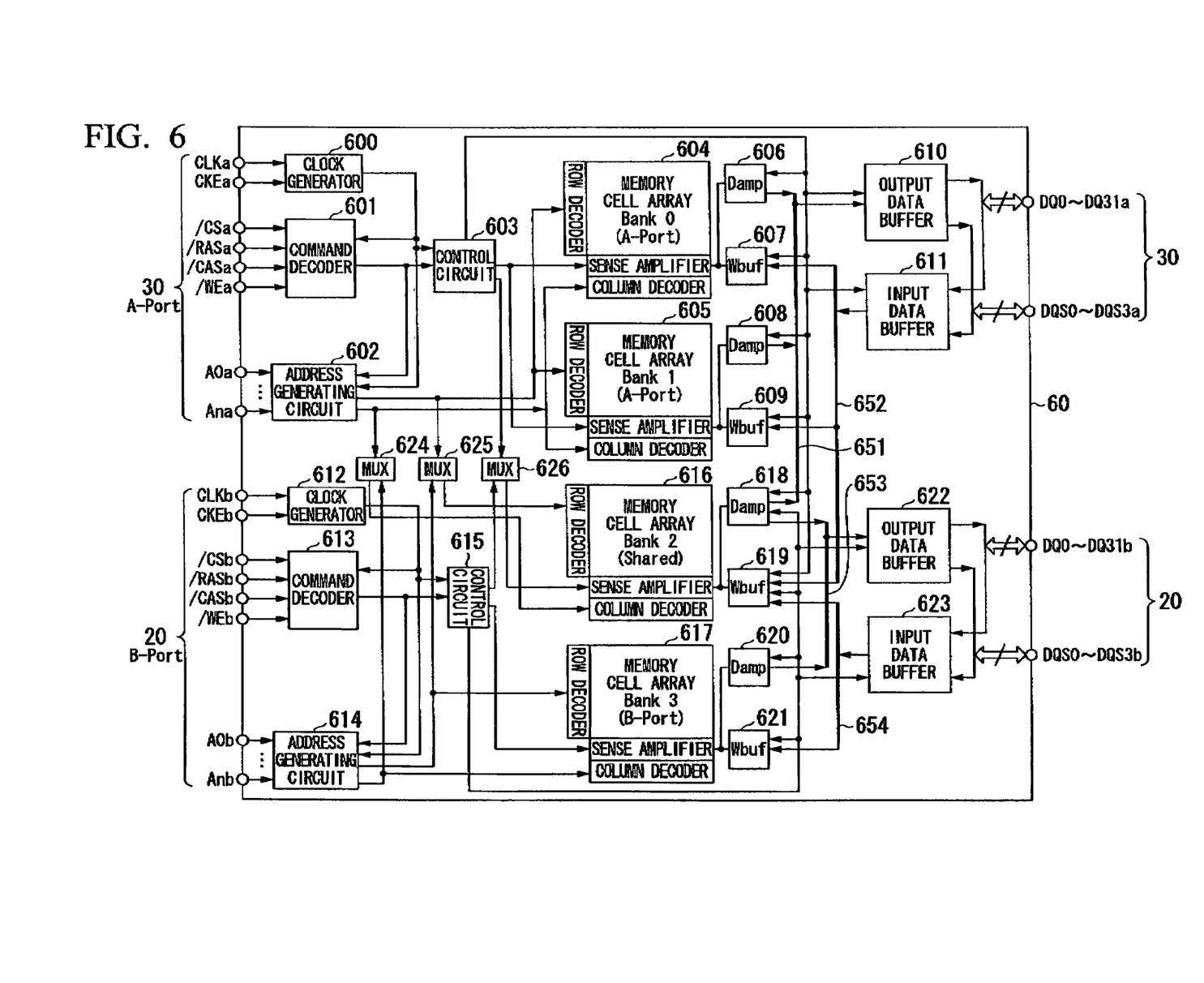
FIG. 6 is a schematic block diagram illustrating the configurations of the dual port DRAM included in the data processing system shown in FIG. 5.

FIG. 6 is a schematic block diagram illustrating the configurations of the dual port DRAM 60 included in the data processing system 2 shown in FIG. 5.

The A-port 30 includes command terminals, address terminals, and data terminals. Terminals performing as the command terminals of the A-port 30 may include, but are not limited to, a /CSa terminal, a /RASa terminal, a /CASa terminal, and a /WEa terminal. Terminals performing as the address terminals of the A-port 30 may include, but are not limited to, an A0$a$ terminal, an A1$a$ terminal . . . an An$a$ terminal Terminals performing as the data terminals of the A-port 30 may include, but are not limited to, a DQ0$a$ terminal, a DQ1$a$ terminal . . . a DQ31$a$ terminal, a DQS0$a$ terminal, a DQS1$a$ terminal . . . a DQS3$a$ terminal.

The B-port 20 includes command terminals, address terminals, and data terminals. Terminals performing as the command terminals of the B-port 20 may include, but are not limited to, a /CSb terminal, a /RASb terminal, a /CASb terminal, and a /WEb terminal. Terminals performing as the address terminals of the B-port 20 may include, but are not limited to, an A0$b$ terminal, an A1$b$ terminal . . . an An$b$ terminal. Terminals performing as the data terminals of the B-port 20 may include, but are not limited to, a DQ0$b$ terminal, a DQ1$b$ terminal . . . a DQ31$b$ terminal, a DQS0$b$ terminal, a DQS1$b$ terminal . . . a DQS3$b$ terminal.

The A-port 30 is accessible to the A-port-dedicated memory cell arrays 604 and 605 and the shared memory cell array 616. A clock generator circuit 600, a command decoder 601, an address generating circuit 602, and a control circuit 603 are used to read data out of the A-port-dedicated memory cell arrays 604 and 605 and the shared memory cell array 616, in accordance with the command from the A-port 30.

The B-port 20 is accessible to the B-port-dedicated memory cell array 617 and the shared memory cell array 616. A clock generator circuit 612, a command decoder 613, an address generating circuit 614, and a control circuit 615 are used to read data out of the B-port-dedicated memory cell array 617 and the shared memory cell array 616, in accordance with the command from the B-port 20.

Figure 7:
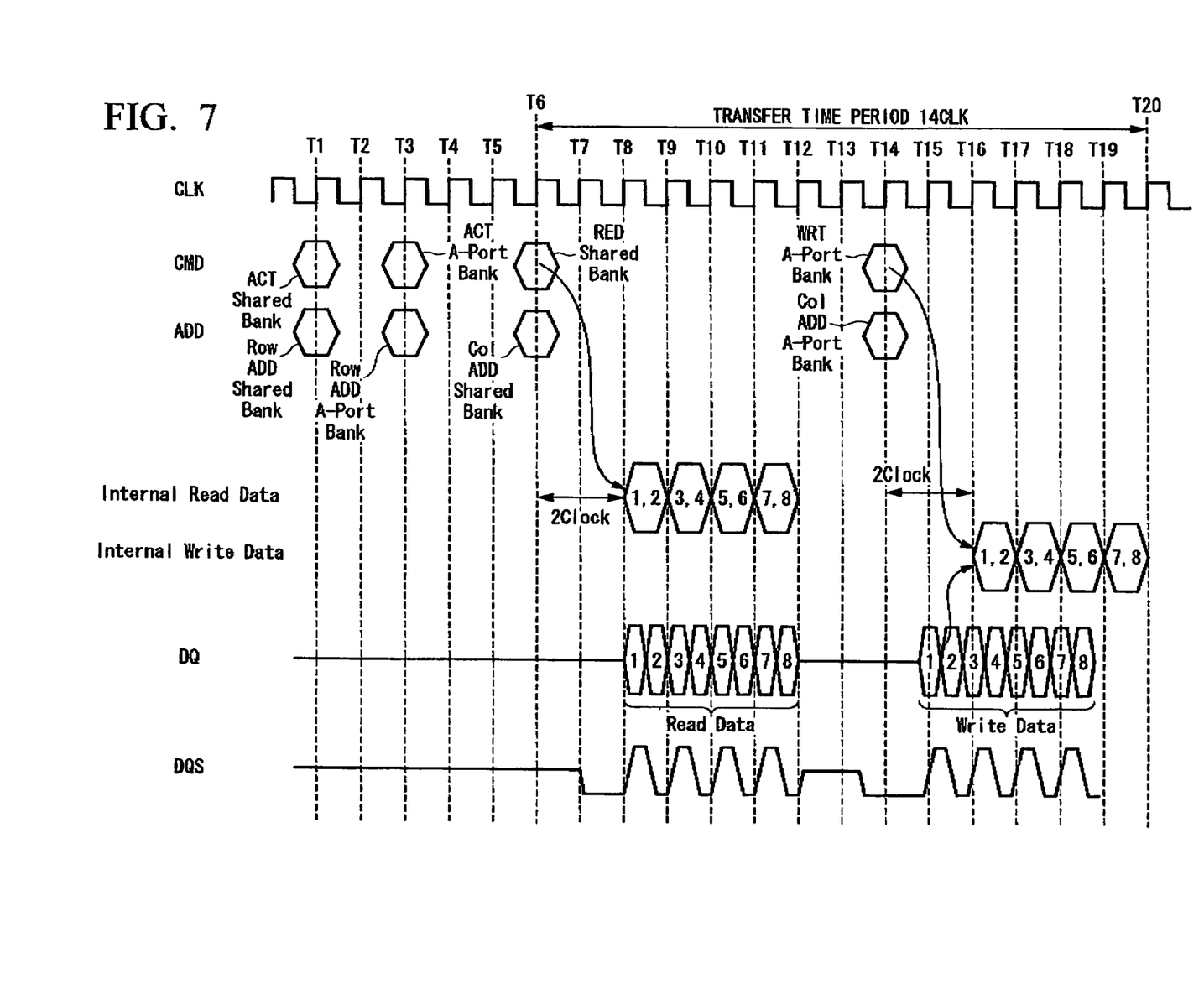
FIG. 7 is a timing chart illustrating the operation of transferring data from the shared memory cell array to the A-port-dedicated memory cell array, wherein the data transfer is performed by operation through the A-port connected to the application processor.

FIG. 7 is a timing chart illustrating the operation of transferring data from the shared memory cell array 616 to the A-port-dedicated memory cell array 605, wherein the data transfer is performed by operation through the A-port 30 connected to the application processor 40. The dual port DRAM 60 may have latency for the read and write commands, wherein the latency corresponds to two clock cycles.

At a timing T1, a command signal ACT is entered from the external device through the command terminal of the A-port 30. The command signal ACT is to activate the shared memory cell array 616, thereby allowing data to be read out the activated shared memory cell array 616 and to be written into the activated shared memory cell array 616. An address signal RowADD is entered from the external device through the address terminal of the A-port 30. The address signal RowADD is to designate a row address of the shared memory cell array 616.

At a timing T3, another command signal ACT is entered from the external device through the command terminal of the A-port 30. The command signal ACT is to activate the A-port-dedicated memory cell array 605 that is dedicated to the A-port 30, thereby allowing data to be read out the activated A-port-dedicated memory cell array 605 and to be written into the activated A-port-dedicated memory cell array 605. An address signal RowADD is entered from the external device through the address terminal of the A-port 30. The address signal RowADD is to designate a row address of the A-port-dedicated memory cell array 605.

At a timing T6, a command signal RED is entered from the external device through the command terminal of the A-port 30. The command signal RED is a burst read command to read the data in the shared memory cell array 616. An address signal ColADD is entered from the external device through the address terminal of the A-port 30.

At a timing T8, the shared memory cell array 616 outputs the data from the data terminals DQ0a, DQ1a ... DQ31a, in accordance with the read command that has been entered at the timing T6. Until a timing T12 the series of data is sequentially read out of the shared memory cell array 616 and output from the data terminals DQ0a, DQ1a ... DQ31a. The series of the output data is sequentially entered into the application processor 40. Reading and outputting operations are performed on clock-cycle by clock-cycle basis.

After the reading and output operations of reading data out of the shared memory cell array 616 and outputting the data from the A-port 20 to the application processors 40 has been completed, then the application processor 40 starts writing operation of writing the data into the A-port-dedicated memory cell array 605.

At a timing T14, a command signal WRT is entered from the external device through the command terminal of the A-port 30. The command signal WRT is to write the data into the A-port-dedicated memory cell array 605. An address signal ColADD is entered from the external device through the address terminal of the A-port 30. The address signal ColADD is to designate a column address of the A-port-dedicated memory cell array 605. In a time period from a timing T15 to a timing T20, the application processor 40 sequentially enters the series of data into the A-port 30 so that the application processor 40 sequentially store the data in the A-port-dedicated memory cell array 605.

Consequently, as shown in FIG. 5, the dual port DRAM 60 performs data transfer to transfer data from the shared memory cell array 616 through the A-port 30 and the application processor 40 to the A-port-dedicated memory cell array 605. Thus, as shown in FIG. 7, the dual port DRAM 60 allows the application processor 40 to perform data write operation of writing data into the A-port-dedicated memory cell array 605 after the data read operation of reading data out of the shared memory cell array 616 has been completed. The reading operation of reading the series of data out of the shared memory cell array 616 continues over the time period from the timing T8 to the timing T12. The writing operation of the series of data into the A-port-dedicated memory cell array 605 starts the timing T16 after four clock cycles when the reading operation has been completed at the timing T12. The dual port DRAM 60 needs longer data-transfer period of time of 14 clock cycles. The above-described operations can be applicable to other data transfer operation from the A-port-dedicated memory cell array 604 or 605 to the shared memory cell array 616.

The above-described operations can be applicable to between the A-port-dedicated memory cell array 604 or 605 and the shared memory cell array 616 involved in the data transfer from the application processor 40 to the baseband processor 10.

The dual port DRAM 60 performs transfer data between the A-port-dedicated memory cell array 604 or 605 and the shared memory cell array 616 through transferring the data to the port to send the data to the processor. Thus, the dual port DRAM 60 performs that the write operation of the series of read data starts after the read operation of those data has been completed. The dual port DRAM 60 needs the increased number of clock cycles for transferring data between the dedicated memory cell array and the shared memory cell array. The increase in the number of clock cycle becomes remarkable as the size of the series of data becomes larger.

The invention will be now described herein with reference to illustrative embodiments. Those skilled in the art will recognize that may alternative embodiments can be accomplished using the teaching of the present invention and that the invention is not limited to the embodiments illustrated for explanatory purpose.

In accordance with one aspect, a semiconductor device may include, but is not limited to, a plurality of memory cell arrays, a plurality of ports, a plurality of internal address generating circuits and a controller. The plurality of internal address generating circuits generates first and second internal addresses of first and second memory cell arrays of the plurality of memory cell arrays. The first internal address designates a first area of the first memory cell array. The second internal address designates a second area of the second memory cell array. The controller reads a series of data from the first area sequentially and writes the series of read data into the second area sequentially without transferring the series of read data to the plurality of ports. The semiconductor device can reduce the number of clock cycles for transferring data between the memory cell arrays. The reduction in the number of clock cycle becomes remarkable as the size of the series of data becomes larger. The semiconductor device may be realized by, but is not limited to, a multi-port DRAM.

The controller can start the operation of writing the series of read data into the second area before the controller completes the operation of reading the series of data from the first area. The semiconductor device can reduce the number of clock cycles for transferring data between the memory cell arrays. The reduction in the number of clock cycle becomes remarkable as the size of the series of data becomes larger.

In some cases, the internal address generating circuit may receive a data transfer command including an address signal from the port The plurality of internal address generating circuits may generate the first and second internal addresses based on the address signal. The controller may read the series of data from the first area sequentially and write the series of read data into the second area sequentially in accordance with the data transfer command.

As described above, the controller reads a series of data from the first area sequentially and writes the series of read data into the second area sequentially without transferring the series of read data to the plurality of ports. In some cases, the semiconductor device may further include, but is not limited to, an internal bus through which the controller transfers the series of data from the first memory cell array to the second memory cell array.

In some cases, the controller can write the read data at a following clock cycle that follows a previous clock cycle at which the controller has read the data. More particularly, the controller may write the read data at a next clock cycle that is next to a previous clock cycle at which the controller has read the data.

In some cases, the plurality of ports may each have at least one command terminal, at least one address terminal, and at least one data terminal. The plurality of internal address generating circuits may each independently receive the data transfer command from the at least one command terminal and the at least one address terminal.

In some cases, the data transfer command may include, but is not limited to, a combination of a burst read command and a burst write command. The burst read command and the burst write command may be sequentially entered from the at least one command terminal and the at least one address terminal.

In some cases, the controller may read the series of data from the first area sequentially in accordance with the burst read command. The controller may write the series of read data into the second area sequentially in accordance with the burst write command.

In some cases, the plurality of memory cell arrays may include, but is not limited to, a plurality of dedicated memory cell arrays and at least one shared memory cell array. The plurality of dedicated memory cell arrays may be each dedicated to a corresponding one of the plurality of ports. The dedicated memory cell array may be ascribable to at least one of the plurality of internal address generating circuits. The at least one shared memory cell array may be shared by the plurality of ports. The at least one shared memory cell array may be accessible to another one of the plurality of internal address generating circuits.

In some cases, the controller may read the series of data out of a first one of the plurality of dedicated memory cell arrays and write the series of read data into the shared memory cell array. Subsequently, the controller may read the series of read data out of the shared memory cell array and write the series of read data into a second one of the plurality of dedicated memory cell arrays.

In accordance with another aspect, a semiconductor device may include, but is not limited to, a plurality of memory cell arrays, a plurality of ports, a plurality of internal address generating circuits and a controller. The plurality of internal address generating circuits may generate first and second internal addresses of first and second memory cell arrays of the plurality of memory cell arrays. The first internal address designates a first area of the first memory cell array. The second internal address designates a second area of the second memory cell array. The controller may perform parallel reading and writing operations of reading a series of data from the first area sequentially and writing the series of read data into the second area sequentially. The controller may start the operation of writing the series of read data into the second area before the controller completes the operation of reading the series of data from the first area. The semiconductor device can reduce the number of clock cycles for transferring data between the memory cell arrays. The reduction in the number of clock cycle becomes remarkable as the size of the series of data becomes larger. The semiconductor device may be realized by, but is not limited to, a multi-port DRAM.

In some cases, the internal address generating circuit may receive a data transfer command including an address signal from the port. The plurality of internal address generating circuits may generate the first and second internal addresses based on the address signal. The controller performs the parallel reading and writing operations in accordance with the data transfer command.

As described above, the controller reads a series of data from the first area sequentially and writes the series of read data into the second area sequentially without transferring the series of read data to the plurality of ports. In some cases, the semiconductor device may further include, but is not limited to, an internal bus through which the controller transfers the series of data from the first memory cell array to the second memory cell array.

In some cases, the plurality of ports may each have at least one command terminal, at least one address terminal, and at least one data terminal. The plurality of internal address generating circuits may each independently receive the data transfer command from the at least one command terminal and the at least one address terminal.

In some cases, the data transfer command may include, but is not limited to, a combination of a burst read command and a burst write command. The burst read command and the burst write command may be sequentially entered from the at least one command terminal and the at least one address terminal.

In some cases, the controller may read the series of data from the first area sequentially in accordance with the burst read command. The controller may write the series of read data into the second area sequentially in accordance with the burst write command.

In some cases, the plurality of memory cell arrays may include, but is not limited to, a plurality of dedicated memory cell arrays and at least one shared memory cell array. The plurality of dedicated memory cell arrays may be each dedicated to a corresponding one of the plurality of ports. The dedicated memory cell array may be ascribable to at least one of the plurality of internal address generating circuits. The at least one shared memory cell array may be shared by the plurality of ports. The at least one shared memory cell array may be accessible to another one of the plurality of internal address generating circuits.

In some cases, the controller may read the series of data out of a first one of the plurality of dedicated memory cell arrays and write the series of read data into the shared memory cell array. Subsequently, the controller may read the series of read data out of the shared memory cell array and write the series of read data into a second one of the plurality of dedicated memory cell arrays.

In accordance with still another aspect, a data processing system may include, but is not limited to, a plurality of memory cell arrays, a plurality of ports, a plurality of processors being each coupled to a corresponding one of the plurality of ports, a plurality of internal address generating circuits and a controller. The internal address generating circuits may receive a data transfer command including an address signal through the port from the processor. The internal address generates circuit generates firs and second internal addresses of first and second memory cell arrays of the plurality of memory cell arrays. The first internal address designates a first area of the first memory cell array. The second internal address designates a second area of the second memory cell array. The controller may read a series of data from the first area sequentially and write the series of read data into the second area sequentially in accordance with the data transfer command, without transferring the series of read data to the plurality of ports. The controller may start the operation of writing the series of read data into the second area before the controller completes the operation of reading the series of data from the first area. The semiconductor device can reduce the number of clock cycles for transferring data between the memory cell arrays. The reduction in the number of clock cycle becomes remarkable as the size of the series of data becomes larger. The processor may be realized by, but not limited to, a baseband processor and an application processor.

Embodiment

Figure 1:
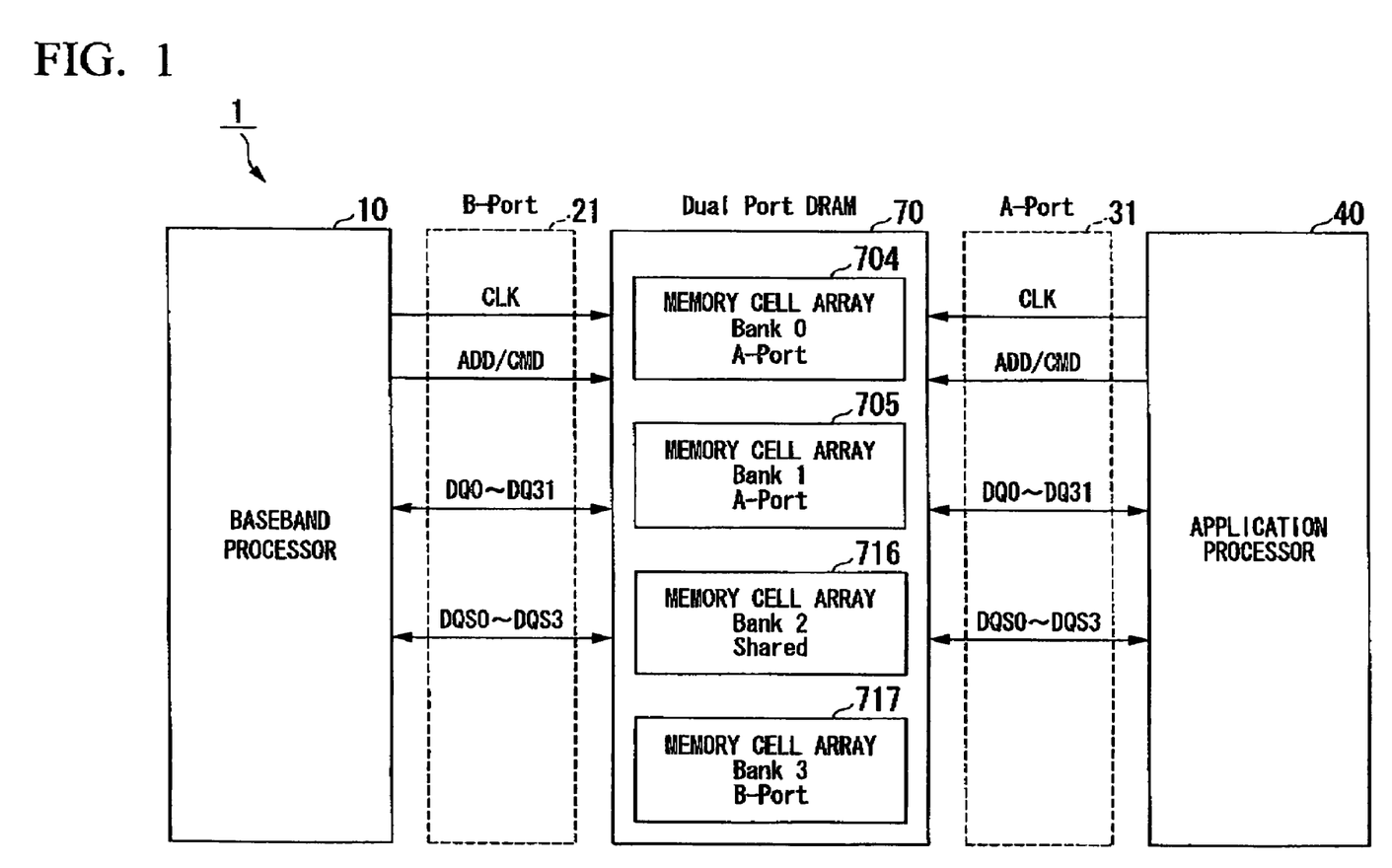
FIG. 1 is a schematic block diagram illustrating a data processing system that includes a dual port DRAM, a baseband processor and an application processor in accordance with the embodiment of the present invention.

The following typical example is a dual port DRAM that has two ports. FIG. 1 is a schematic block diagram illustrating a data processing system 1 that includes a dual port DRAM 70, a baseband processor 10 and an application processor 40 in accordance with the first embodiment of the present invention. The dual port DRAM 70 performs as a multi-port DRAM. The dual port DRAM 70 has two ports, for example, an A-port and a B-port. The dual port DRAM 70 is connected through a B-port bus 21 to the baseband processor 10. The dual port DRAM 70 is connected through an A-port bus 31 to the application processor 40. The A-port bus 31 connects between the dual port DRAM 70 and the application processor 40. The B-port bus 21 connects between the dual port DRAM 70 and the baseband processor 10.

The dual port DRAM 70 may include, but is not limited to, A-port-dedicated memory cell arrays 704 and 705, a shared memory cell array 716, and a B-port-dedicated memory cell array 717.

Figure 2:
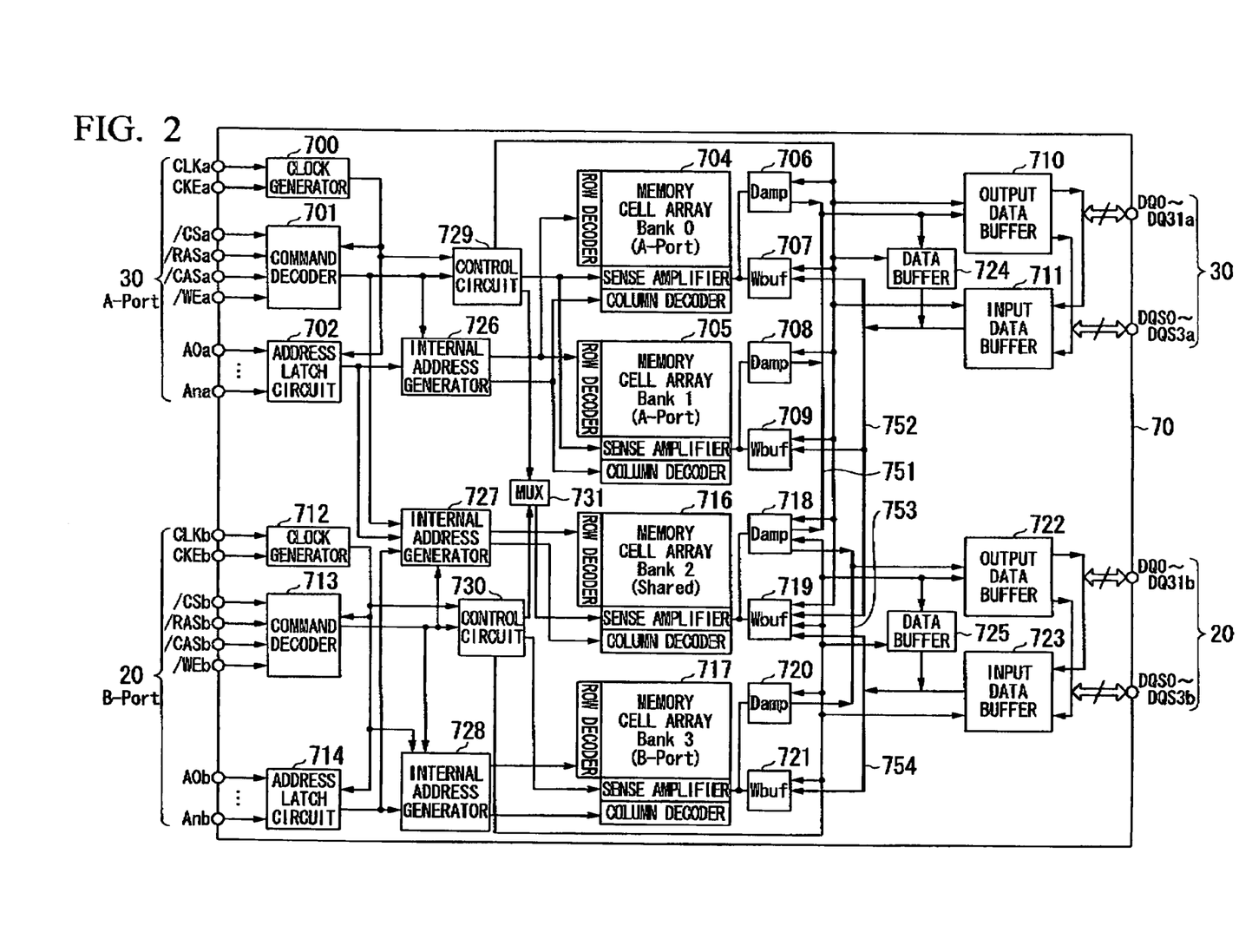
FIG. 2 is a schematic block diagram illustrating the configurations of the dual port DRAM included in the data processing system 1 shown in FIG. 1.

FIG. 2 is a schematic block diagram illustrating the configurations of the dual port DRAM 70 included in the data processing system 1 shown in FIG. 1.

The dual port DRAM 70 may have, but is not limited to, an A-port 30, and a B-port 20. The A-port 30 may include, but is not limited to, a CLKa terminal and a CKEa terminal, each of which receives clock signal. The A-port 30 may further include, but is not limited to, a /CSa terminal, a /RASa terminal and a /CASa terminal, and a /WEa terminal, each of which receives command signal. The A-port 30 may furthermore include, but is not limited to, an A0a terminal, an A1a terminal . . . Ana terminal, each of which receives address signal. The A-port 30 may furthermore include, but is not limited to, a DQ0a terminal, a DQ1a terminal . . . a DQ31a terminal, each of which receives data signal. The A-port 30 may furthermore include, but is not limited to, a DQS0a terminal, a DQS1a terminal . . . a DQS3a terminal, each of which receives data strobe signal.

The B-port 20 may include, but is not limited to, a CLKb terminal and a CKEb terminal, each of which receives clock signal. The B-port 20 may further include, but is not limited to, a /CSb terminal, a /RASb terminal and a /CASb terminal, and a /WEb terminal, each of which receives command signal. The B-port 20 may furthermore include, but is not limited to, an A0b terminal, an A1b, terminal . . . Anb terminal, each of which receives address signal. The B-port 20 may furthermore include, but is not limited to, a DQ0b terminal, a DQ1b terminal . . . a DQ31b terminal, each of which receives data signal. The B-port 20 may furthermore include, but is not limited to, a DQS0b terminal, a DQS1b terminal . . . a DQS3b terminal, each of which receives data strobe signal.

The dual port DRAM 70 may include, but is not limited to, A-port-dedicated memory cell arrays 704 and 705, a shared memory cell array 716, and a B-port-dedicated memory cell array 717. Each of the A-port-dedicated memory cell arrays 704 and 705, the shared memory cell array 716, and the B-port-dedicated memory cell array 717 has a row decoder, column decoder and a sense amplifier.

The dual port DR 70 may further include, but is not limited to, clock generating circuits 700 and 712, command decoders 701 and 713, and address latch circuits 702 and 714.

The dual port DRAM 70 may furthermore include, but is not limited to, read data amplifier circuits Damp 706, 708, 718, and 720 and write data amplifier circuits Wbuf 707, 709, 719, and 721.

The dual port DRAM 70 may furthermore include, but is not limited to, output data buffers 710 and 722, input data buffers 711 and 723, and data buffers 724 and 725.

The dual port DRAM 70 may furthermore include, but is not limited to, internal address generating circuits 726, 727 and 728, control circuits 729 and 730, a selecting circuit MUX 731, an A-read bus 751, an A-write bus 752, a B-read bus 753, and a B-write bus 754.

Terminals performing as the clock terminals may include, but are not limited to, the CLKa terminal, the CKEa terminal, the CLKb terminal, and the CKEa terminal.

Terminals performing as the command terminals may include, but are not limited to, the /CSa terminal, the /RASa terminal, the /CASa terminal, the /WEa terminal, the /CSb terminal, the /RASb terminal, the /CASb terminal, and the /WEb terminal.

Terminals performing as the address terminals may include, but are not limited to, the A0a terminal, the A1a terminal . . . Ana terminal, the A0b terminal, the A1b terminal . . . Anb terminal.

Terminals performing as the data terminals may include, but are not limited to, the DQ0a terminal, the DQ1a terminal . . . the DQ31a terminal, the DQS0a terminal, the DQS1a terminal . . . the DQS3a terminal, the DQ0b terminal, the DQ1b terminal . . . the DQ31b terminal, the DQS0b terminal, the DQS1b terminal . . . the DQS3b terminal.

The dual port DRAM 70 may have latency for the read and write commands, wherein the latency corresponds to two clock cycles. The latency corresponding to two clock cycles means that data is output after two clock cycles from the input of read command, and also that data is input into the memory cell array after two clock cycles from the input of write command. Thus, data is input into the dual port DRAM 70 after one clock cycle from the input of write command. The dual port DRAM 70 may have burst length of 8 and data width of 32 bits.

The A-port-dedicated memory cell arrays 704 and 705 are dedicated to the A-port 30. The A-port-dedicated memory cell arrays 704 and 705 each perform as a memory area that allows that data as being entered only from A-port 30 is written therein and the data stored therein is read out and transferred to the A-port 30 only. Namely, the A-port-dedicated memory cell arrays 704 and 705 each allow only the A-port 30 to have access thereto.

The shared memory cell array 716 is shared by the A-port 30 and the B-port 20. The shared memory cell array 716 allows the A-port 30 and the B-port 20 to make access thereto. The shared memory cell array 716 is accessible from the A-port 30 and the B-port 20. The shared memory cell array 716 performs as a memory area that allows that data as being entered from A-port 30 and the B-port 20 is written therein and the data stored therein is read out and transferred to the A-port 30 and the B-port 20.

The B-port-dedicated memory cell array 717 is dedicated to the B-port 20. The B-port-dedicated memory cell array 717 each perform as a memory area that allows that data as being entered only from B-port 20 is written therein and the data stored therein is read out and transferred to the B-port 20 only. Namely, the B-port-dedicated memory cell array 717 each allow only the B-port 20 to have access thereto.

The dual port DRAM 70 includes the clock generating circuit 700. The clock generating circuit 700 receives inputs of external clock signals from the CLKa terminal and the CKEa terminal. The CLKa terminal and the CKEa terminal belong to the A-port 30. The clock generating circuit 700 generate internal clock signals based on the external clock signals. The clock generating circuit 700 supplies the internal clock signals to the command decoder 701, the address latch circuit 702 and the control circuit 729.

The command decoder 701 receives inputs of command signals from the command terminals such as the /CSa terminal, the /RASa terminal, the /CASa terminal, and the /WEa terminal, which belong to the A-port 30. The command decoder 701 receives an input of the internal clock signal from the clock generating circuit 700. The command decoder 701 decodes the command signals, synchronized with the clock signal. In some cases, the command decoder 701 receives an input of a read command from the command terminal belonging to the A-port 30 at the first cycle in a series of continuing plural clock cycles, wherein the read command is a command to transfer data from the A-port 30 to the shared memory cell array 716. Subsequently, the command decoder 701 receives an input of a write command from the command terminal belonging to the A-port 30 at the later cycle in the series of continuing plural clock cycles, wherein the write command is a command to transfer data from the shared memory cell array 716 to the A-port-dedicated memory cell array 704 or 705. In this case, the command decoder 701 decodes the command signals as a data transfer command to transfer data from the shared memory cell array 716 to the A-port-dedicated memory cell array 704 or 705.

In other cases, the command decoder 701 receives an input of a read command from the command terminal belonging to the A-port 30 at the first cycle in a series of continuing plural clock cycles, wherein the read command is a command to transfer data from the A-port 30 to the A-port-dedicated memory cell array 704 or 705. Subsequently, the command decoder 701 receives an input of a write command from the command terminal belonging to the A-port 30 at the later cycle in the series of continuing plural clock cycles, wherein the write command is a command to transfer data from the A-port-dedicated memory cell array 704 or 705 to the shared memory cell array 716. In this case, the command decoder 701 decodes the command signals as a data transfer command to transfer data from the A-port-dedicated memory cell array 704 or 705 to the shared memory cell array 716.

The command decoder 701 supplies the decode result to the internal address generating circuits 726 and 727 and the control circuit 729.

The address latch circuit 702 receives inputs of the address signals from the address terminals such as the A0$a$ terminal, the A1$a$ terminal . . . and An$a$ terminal, which belong to the A-port 30. The address latch circuit 702 receives an input of the clock signal from the clock generating circuit 700. The address latch circuit 702 reads the address signal, synchronized with the clock signal. The address latch circuit 702 supplies the address signal to the internal address generating circuits 726 and 727.

The A-port-dedicated memory cell array 704 has a row decoder that decodes the row address, a column decoder that decodes the column address, and a sense amplifier. In read operation, the sense amplifier of the A-port-dedicated memory cell array 704 receives a sense amplifier activating signal from the control circuit 729. The column decoder and the row decoder of the A-port-dedicated memory cell array 704 receive a column address and a row address from the internal address generating circuit 726. The sense amplifier of the A-port-dedicated memory cell array 704 reads data out of a memory cell in the A-port-dedicated memory cell array 704, wherein the memory cell is designated by the column address and the row address, so that the read data is supplied to the read data amplifier circuit Damp 706.

In write operation, the sense amplifier of the A-port-dedicated memory cell array 704 receives a sense amplifier activating signal from the control circuit 729. The column decoder and the row decoder of the A-port-dedicated memory cell array 704 receive a column address and a row address from the internal address generating circuit 726. The sense amplifier of the A-port-dedicated memory cell array 704 receives data from the write data amplifier circuit Wbuf 707. The sense amplifier of the A-port-dedicated memory cell array 704 writes the data into a memory cell in the A-port-dedicated memory cell array 704, wherein the memory cell is designated by the column address and the row address.

The A-port-dedicated memory cell array 705 has a row decoder that decodes the row address, a column decoder that decodes the column address, and a sense amplifier. In read operation, the sense amplifier of the A-port-dedicated memory cell array 705 receives a sense amplifier activating signal from the control circuit 729. The column decoder and the row decoder of the A-port-dedicated memory cell array 705 receive a column address and a row address from the internal address generating circuit 726. The sense amplifier of the A-port-dedicated memory cell array 705 reads data out of a memory cell in the A-port-dedicated memory cell array 705, wherein the memory cell is designated by the column address and the row address, so that the read data is supplied to the read data amplifier circuit Damp 708.

In write operation, the sense amplifier of the A-port-dedicated memory cell array 705 receives a sense amplifier activating signal from the control circuit 729. The column decoder and the row decoder of the A-port-dedicated memory cell array 705 receive a column address and a row address from the internal address generating circuit 726. The sense amplifier of the A-port-dedicated memory cell array 705 receives data from the write data amplifier circuit Wbuf 709. The sense amplifier of the A-port-dedicated memory cell array 705 writes the data into a memory cell in the A-port-dedicated memory cell array 705, wherein the memory cell is designated by the column address and the row address.

The read data amplifier circuit Damp 706 receives the data from the A-port-dedicated memory cell array 704. The read data amplifier circuit Damp 706 receives an A-read bus control signal from the control circuit 729. The read data amplifier circuit Damp 706 supplies the data to the A-read bus 751 in accordance with the A-read bus control signal.

The write data amplifier circuit Wbuf 707 receives an A-write bus control signal from the control circuit 729. In accordance with the A-write bus control signal, the write data amplifier circuit Wbuf 707 reads data out of the A-write bus 752 and supplies the data to the A-port-dedicated memory cell array 704.

The read data amplifier circuit Damp 708 receives the data from the A-port-dedicated memory cell array 705. The read data amplifier circuit Damp 706 receives an A-read bus control signal from the control circuit 729. The read data amplifier circuit Damp 708 supplies the data to the A-read bus 751 in accordance with the A-read bus control signal.

The write data amplifier circuit Wbuf 709 receives an A-write bus control signal from the control circuit 729. In accordance with the A-write bus control signal, the write data amplifier circuit Wbuf 709 reads data out of the A-write bus 752 and supplies the data to the A-port-dedicated memory cell array 705.

The output data buffer 710 receives an A-read bus control signal from the control circuit 729. In accordance with the A-write bus control signal, the output data buffer 710 reads data out of the A-write bus 751 and supplies the data to the data terminals such as the DQ0$a$ terminal, the DQ1$a$ terminal . . . the DQ31$a$ terminal, which belong to the A-port 30. The output data buffer 710 transitions the data strobe signal upon supplying the data to the data terminals, so as to give an external device a notice of data output through the data terminals belonging to the A-port 30.

The input data buffer 711 receives the A-read bus control signal from the control circuit 729. The input data buffer 711 receives data strobe signals from the data terminals such as the DQS0$a$ terminal, the DQS1$a$ terminal . . . the DQS3$a$ terminal, which belong to the A-port 30. In accordance with the A-read bus control signal and the data strobe signals, the input data buffer 711 reads the data out of the data terminals such as the DQ0a terminal, the DQ1a terminal . . . the DQ31a terminal, which belong to the A-port 30. The input data buffer 711 supplies the read data to the A-write bus 752.

The dual port DRAM 70 includes the clock generating circuit 712. The clock generating circuit 712 receives inputs of external clock signals from the CLKb terminal and the CKEb terminal. The CLKb terminal and the CKEb terminal belong to the B-port 20. The clock generating circuit 712 generate internal clock signals based on the external clock signals. The clock generating circuit 712 supplies the internal clock signals to the command decoder 713, the address latch circuit 714 and the control circuit 730.

The command decoder 713 receives inputs of command signals from the command terminals such as the /CSb terminal, the /RASb terminal, the /CASb terminal, and the /WEb terminal, which belong to the B-port 20. The command decoder 713 receives an input of the internal clock signal from the clock generating circuit 712. The command decoder 713 decodes the command signals, synchronized with the clock signal. In some cases, the command decoder 713 receives an input of a read command from the command terminal belonging to the B-port 20 at the first cycle in a series of continuing plural clock cycles, wherein the read command is a command to transfer data from the B-port 20 to the shared memory cell array 716. Subsequently, the command decoder 713 receives an input of a write command from the command terminal belonging to the B-port 20 at the later cycle in the series of continuing plural clock cycles, wherein the write command is a command to transfer data from the shared memory cell array 716 to the B-port-dedicated memory cell array 717. In this case, the command decoder 713 decodes the command signals as a data transfer command to transfer data from the shared memory cell array 716 to the B-port-dedicated memory cell array 717.

In other cases, the command decoder 713 receives an input of a read command from the command terminal belonging to the B-port 20 at the first cycle in a series of continuing plural clock cycles, wherein the read command is a command to transfer data from the B-port 20 to the B-port-dedicated memory cell array 717. Subsequently, the command decoder 713 receives an input of a write command from the command terminal belonging to the B-port 20 at the later cycle in the series of continuing plural clock cycles, wherein the write command is a command to transfer data from the B-port-dedicated memory cell array 717 to the shared memory cell array 716. In this case, the command decoder 713 decodes the command signals as a data transfer command to transfer data from the B-port-dedicated memory cell array 717 to the shared memory cell array 716.

The command decoder 713 supplies the decode result to the internal address generating circuits 727 and 728 and the control circuit 730.

The address latch circuit 714 receives inputs of the address signals from the address terminals such as the A0b terminal, the A1b terminal, . . . and Anb terminal, which belong to the B-port 20. The address latch circuit 714 receives an input of the clock signal from the clock generating circuit 712. The address latch circuit 714 reads the address signal, synchronized with the clock signal. The address latch circuit 714 supplies the address signal to the internal address generating circuits 727 and 728.

The shed memory cell array 716 has a row decoder that decodes the row address, a column decoder that decodes the column address, and a sense amplifier. In read operation, the sense amplifier of the shared memory cell array 716 receives a sense amplifier activating signal from the selecting circuit MUX 731. The column decoder and the row decoder of the shared memory cell array 716 receive a column address and a row address from the internal address generating circuit 727. The sense amplifier of the shared memory cell array 716 reads data out of a memory cell in the shared memory cell array 716, wherein the memory cell is designated by the column address and the row address, so that the read data is supplied to the read data amplifier circuit Damp 718.

In write operation, the sense amplifier of the shared memory cell array 716 receives a sense amplifier activating signal from the selecting circuit MUX 731. The column decoder and the row decoder of the shared memory cell array 716 receive a column address and a row address from the internal address generating circuit 727. The sense amplifier of the shared memory cell array 716 receives data from the write data amplifier circuit Wbuf 719. The sense amplifier of the shared memory cell array 716 writes the data into a memory cell in the shared memory cell array 716, wherein the memory cell is designated by the column address and the row address.

The B-port-dedicated memory cell array 717 has a row decoder that decodes the row address, a column decoder that decodes the column address, and a sense amplifier. In read operation, the sense amplifier of the B-port-dedicated memory cell array 717 receives a sense amplifier activating signal from the control circuit 730. The column decoder and the row decoder of the B-port-dedicated memory cell array 717 receive a column address and a row address from the internal address generating circuit 728. The sense amplifier of the B-port-dedicated memory cell array 717 reads data out of a memory cell in the B-port-dedicated memory cell array 717, wherein the memory cell is designated by the column address and the row address, so that the read data is supplied to the read data amplifier circuit Damp 720.

In write operation, the sense amplifier of the B-port-dedicated memory cell array 717 receives a sense amplifier activating signal from the control circuit 730. The column decoder and the row decoder of the B-port-dedicated memory cell array 717 receive a column address and a row address from the internal address generating circuit 728. The sense amplifier of the B-port-dedicated memory cell array 717 receives data from the write data amplifier circuit Wbuf 721. The sense amplifier of the B-port-dedicated memory cell array 717 writes the data into a memory cell in the B-port-dedicated memory cell array 717, wherein the memory cell is designated by the column address and the row address.

The read data amplifier circuit Damp 718 receives the data from the shared memory cell array 716. The read data amplifier circuit Damp 718 receives an A-read bus control signal from the control circuit 729. The read data amplifier circuit Damp 718 supplies the data to the A-read bus 751 in accordance with the A-read bus control signal.

The read data amplifier circuit Damp 718 receives the data from the shared memory cell array 716. The read data amplifier circuit Damp 718 receives a B-read bus control signal from the control circuit 730. The read data amplifier circuit Damp 718 supplies the data to the B-read bus 753 in accordance with the B-read bus control signal.

The write data amplifier circuit Wbuf 719 receives an A-write bus control signal from the control circuit 729. In accordance with the A-write bus control signal, the write data amplifier circuit Wbuf 719 reads data out of the A-write bus 752 and supplies the data to the shared memory cell array 716. The write data amplifier circuit Wbuf 719 receives a B-write bus control signal from the control circuit 730. In accordance with the B-write bus control signal, the write data amplifier circuit Wbuf 719 reads data out of the B-write bus 754 and supplies the data to the shared memory cell array 716.

The read data amplifier circuit Damp 720 receives the data from the B-port-dedicated memory cell array 717. The read data amplifier circuit Damp 720 receives a B-read bus control signal from the control circuit 730. The read data amplifier circuit Damp 720 supplies the data to the B-read bus 753 in accordance with the B-read bus control signal.

The write data amplifier circuit Wbuf 721 receives a B-write bus control signal from the control circuit 730. In accordance with the B-write bus control signal, the write data amplifier circuit Wbuf 721 reads data out of the B-write bus 754 and supplies the data to the B-port-dedicated memory cell array 717.

The output data buffer 722 receives a B-read bus control signal from the control circuit 730. In accordance with the B-write bus control signal, the output data buffer 722 reads data out of the B-write bus 753 and supplies the data to the data terminals such as the DQ0*b* terminal, the DQ1*b* terminal . . . the DQ31*b* terminal, which belong to the B-port 20. The output data buffer 722 transitions the data strobe signal upon supplying the data to the data terminals, so as to give an external device a notice of data output through the data terminals belonging to the B-port 20.

The input data buffer 723 receives the B-write bus control signal from the control circuit 730. The input data buffer 723 receives data strobe signals from the data terminals such as the DQS0*b* terminal, the DQS1*b* terminal . . . the DQS3*b* terminal, which belong to the B-port 20. In accordance with the B-write bus control signal and the data strobe signals, the input data buffer 723 reads the data out of the data terminals such as the DQ0*b* terminal, the DQ1*b* terminal . . . the DQ31*b* terminal, which belong to the B-port 20. The input data buffer 723 supplies the read data to the B-write bus 754.

The data buffer 724 receives the A-read bus control signal and the A-write bus control signal from the control circuit 729. In accordance with the A-read bus control signal and the A-write bus control signal, the data buffer 724 reads data out of the A-read bus 751 and supplies the read data to the A-write bus 752.

The input data buffer 725 receives the B-read bus control signal and the B-write bus control signal from the control circuit 730. In accordance with the B-read bus control signal and the B-write bus control signal, the input data buffer 725 reads data out of the B-read bus 753 and supplies the read data to the B-write bus 754.

The internal address generating circuit 726 receives the decoded result from the command decoder 701. The internal address generating circuit 726 receives the address signal from the address latch circuit 702. The internal address generating circuit 726 generates a row address and a column address from the address signal, based on the decoded result. The internal address generating circuit 726 supplies the row address and the column address to the A-port-dedicated memory cell arrays 704 and 705.

The internal address generating circuit 727 receives the decoded result from the command decoder 701. The internal address generating circuit 727 receives the address signal from the address latch circuit 702. The internal address generating circuit 727 receives the decoded result from the command decoder 713. The internal address generating circuit 727 receives the address signal from the address latch circuit 714. The internal address generating circuit 727 generates a row address and a column address from the address signal that has been supplied from the address latch circuit 702, based on the decoded result that has been supplied from the command decoder 701. The internal address generating circuit 727 generates a row address and a column address from the address signal that has been supplied from the address latch circuit 714, based on the decoded result that has been supplied from the command decoder 713. The internal address generating circuit 727 supplies the row addresses and the column addresses to the shared memory cell array 716.

The internal address generating circuit 728 receives the decoded result from the command decoder 713. The internal address generating circuit 728 receives the address signal from the address latch circuit 714. The internal address generating circuit 728 generates a row address and a column address from the address signal, based on the decoded result. The internal address generating circuit 728 supplies the row address and the column address to the B-port-dedicated memory cell array 717.

The control circuit 729 receives the clock signal from the clock generating circuit 700. The control circuit 729 also receives the recoded result from the command decoder 701. The control circuit 729 generates a sense amplifier activation signal based on the decoded result, wherein the generation is synchronized with the clock signal. The control circuit 729 supplies the sense amplifier activation signal to the sense amplifiers of the A-port-dedicated memory cell arrays 704 and 705 and to the selecting circuit MUX 731. The control circuit 729 generates an A-read bus control signal based on the decoded result, wherein the generation is synchronized with the clock signal. The A-read bus control signal provides instructions on the data flow of the A-read bus 751. The control circuit 729 supplies the A-read bus control signal to the read data amplifier circuits Damp 706, 708, and 718 and to the output data buffer 710. The control circuit 729 generates an A-write bus control signal based on the decoded result, wherein the generation is synchronized with the clock signal. The A-write bus control signal provides instructions on the data flow of the A-write bus 752. The control circuit 729 supplies the A-write bus control signal to the data amplifier circuits Wbuf 707, 709, and 719 performing as the write data buffers and to the input data buffer 711.

The control circuit 730 receives the clock signal from the clock generating circuit 712. The control circuit 730 also receives the recoded result from the command decoder 713. The control circuit 730 generates a sense amplifier activation signal based on the decoded result, wherein the generation is synchronized with the clock signal. The control circuit 730 supplies the sense amplifier activation signal to the sense amplifier of the B-port-dedicated memory cell array 717 and to the selecting circuit MUX 731. The control circuit 730 generates a B-read bus control signal based on the decoded result, wherein the generation is synchronized with the clock signal. The B-read bus control signal provides instructions on the data flow of the B-read bus 753. The control circuit 730 supplies the B-read bus control signal to the read data amplifier circuits Damp 718, and 720 and to the output data buffer 722. The control circuit 730 generates a B-write bus control signal based on the decoded result, wherein the generation is synchronized with the clock signal. The B-write bus control signal provides instructions on the data flow of the B-write bus 754. The control circuit 730 supplies the B-write bus control signal to the data amplifier circuits Wbuf 719, and 721 performing as the write data buffers and to the input data buffer 723.

The selecting circuit MUX 731 receives the sense amplifier activation signals from the control circuits 729 and 730. The selecting circuit MUX 731 selects one of the sense amplifier activation signals. The selecting circuit MUX 731 supplies the selected sense amplifier activation signal to the shared memory cell array 716.

A semiconductor memory device can be realized by, but not limited to, the multi-port DRAM that has a plurality of ports. The ports of the multi-port DRAM can be realized by, but not limited to, the A-port 30 and the B-port 20. Each port of the multi-port DRAM may be connected to a processor. The processors connected to the ports of the multi-port DRAM can be realized by, but not limited to, the baseband processor 10 and the application processor 40. The multi-port DRAM may include, but is not limited to, a controller and an internal bus. In some cases, the controller may include, but is not limited to, the command decoders 701 and 713 and the control circuits 729 and 730. In some cases, the internal bus may include, but is not limited to, the A-read bus 751, the A-write bus 752, the B-read bus 753, and the B-write bus 754.

Figure 3:
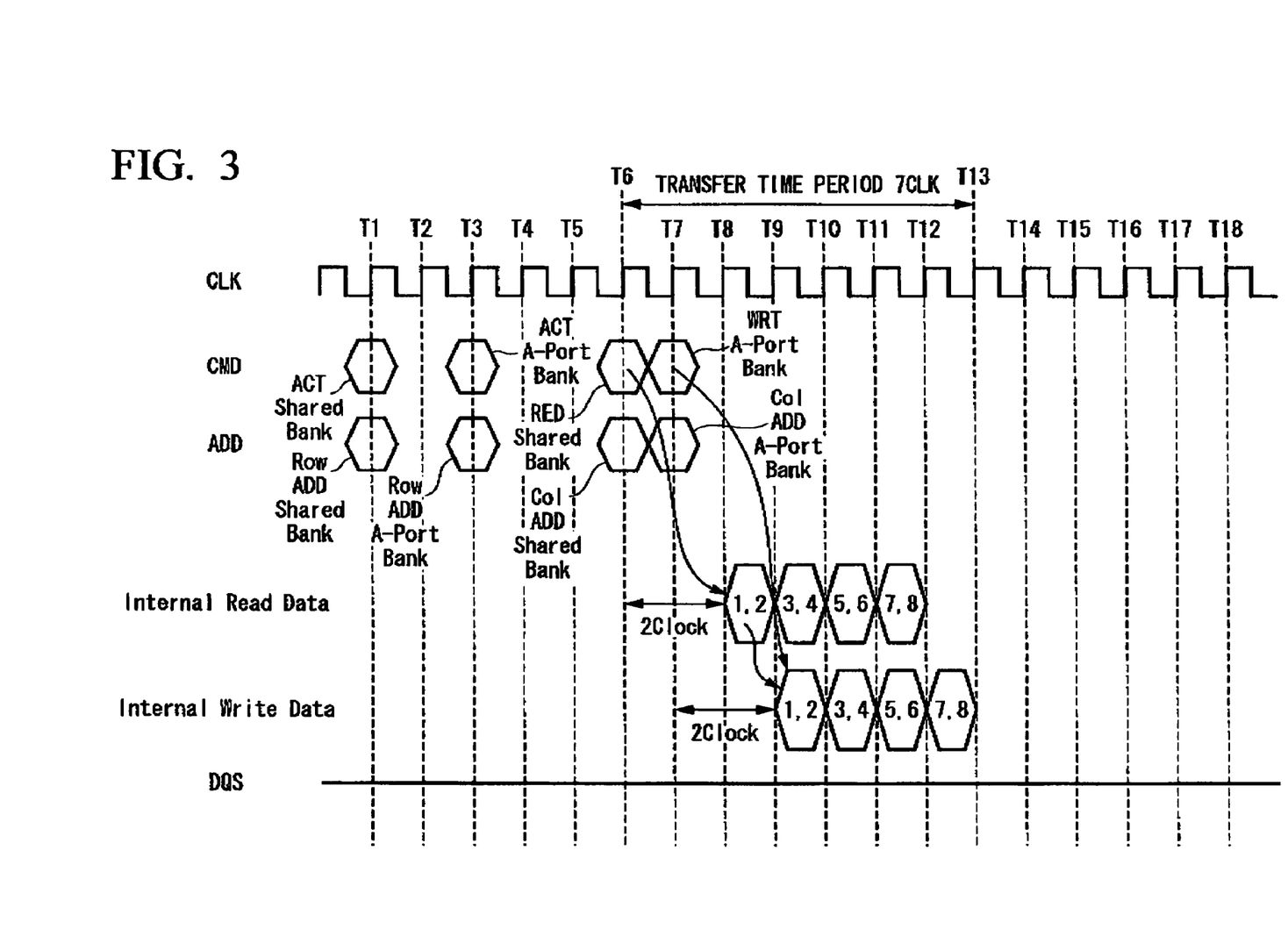
FIG. 3 is a timing chart illustrating the operation of transferring data from a shared memory cell array to an A-port-dedicated memory cell array included in the dual port DRAM shown in FIG. 2.

FIG. 3 is a timing chart illustrating the operation of transferring data from the shared memory cell array 716 to the A-port-dedicated memory cell array 705, wherein the data transfer is performed by operation through the A-port 30. The data transfer is performed as follows. A read command is entered from an external device to the A-port 30 at a clock cycle of the clock signal. The read command is a command to read data out of the shared memory cell array 716. A write command is then entered from the external device to the A-port 30 at a clock cycle next to the clock cycle at which the read command has been entered. The write command is a command to write data into the A-port-dedicated memory cell array 705. Namely, the data transfer is performed by entering the read command at the clock cycle and then entering the write command at the next clock cycle.

At a timing T1, a command signal ACT is entered from the external device through the command terminal of the A-port 30. The command signal ACT is to activate the shared memory cell array 716, thereby allowing data to be read out the activated shared memory cell array 716 and to be written into the activated shared memory cell array 716. An address signal RowADD is entered from the external device through the address terminal of the A-port 30. The address signal RowADD is to designate a row address of the shared memory cell array 716. The command decoder 701 decodes the command signal that has been entered through the command terminal of the A-port 30. The command decoder 701 supplies the decoded result to the internal address generating circuit 727 and the control circuit 729.

The address latch circuit 702 reads the address signal RowADD that has been entered through the address terminal of the A-port 30. The address latch circuit 702 supplies the address signal RowADD to the internal address generating circuit 727.

The internal address generating circuit 727 decodes the address signal, based on the decoded result, thereby generating a row address. The internal address generating circuit 727 supplies the row address to the shared memory cell array 716, allow reading and writing data to a memory area designated by the row address of the shared memory cell array 716.

At a timing T3, another command signal ACT is entered from the external device through the command terminal of the A-port 30. The command signal ACT is to activate the A-port-dedicated memory cell array 705 that is dedicated to the A-port 30, thereby allowing data to be read out the activated A-port-dedicated memory cell array 705 and to be written into the activated A-port-dedicated memory cell array 705. An address signal RowADD is entered from the external device through the address terminal of the A-port 30. The address signal RowADD is to designate a row address of the A-port-dedicated memory cell array 705. The command decoder 701 decodes the command signal that has been entered through the command terminal of the A-port 30. The command decoder 701 supplies the decoded result to the internal address generating circuit 726 and the control circuit 729.

The address latch circuit 702 reads the address signal RowADD that has been entered through the address terminal of the A-port 30. The address latch circuit 702 supplies the address signal RowADD to the internal address generating circuit 726.

The internal address generating circuit 726 decodes the address signal, based on the decoded result, thereby generating a row address. The internal address generating circuit 726 supplies the row address to the A-port-dedicated memory cell array 705, allow reading and writing data to a memory area designated by the row address of the A-port-dedicated memory cell array 705.

At a timing T6, a command signal RED is entered from the external device through the command terminal of the A-port 30. The command signal RED is to read the data in the shared memory cell array 716. An address signal ColADD is entered from the external device through the address terminal of the A-port 30. The address signal ColADD is to designate a column address of the shared memory cell array 716. The command decoder 701 decodes the command signal that has been entered through the command terminal of the A-port 30. The command decoder 701 supplies the decoded result to the internal address generating circuit 727 and the control circuit 729. The address latch circuit 702 reads the address signal ColADD that has been entered through the address terminal of the A-port 30. The address latch circuit 702 supplies the address signal ColADD to the internal address generating circuit 727. The internal address generating circuit 727 supplies, based on the decoded result, eight column addresses one-by-one at every clock cycle, from the address signal.

The control circuit 729 generates the A-read bus control signal, based on the recoded results. The control circuit 729 supplies the A-read bus control signal the read data amplifier circuit Damp 718 and the output data buffer 710 so that the data as output from the shared memory cell array 716 is transmitted through the read data amplifier circuit Damp 718 and the output data buffer 710 to the terminals DQS0*a*, DQS31*a* of the A-port 30.

At a timing T7, a command signal WRT is entered from the external device through the command terminal of the A-port 30. The command signal WRT is to write the data into the A-port-dedicated memory cell array 705. An address signal ColADD is entered from the external device through the address terminal of the A-port 30. The address signal ColADD is to designate a column address of the A-port-dedicated memory cell array 705. The command decoder 701 decodes the read command and the write command as the command to transfer data from the shared memory cell array 716 to the A-port-dedicated memory cell array 705. The read command is to read data out of the shared memory cell array 716 at the timing T6. The write command has been input at the timing T7 subsequent to the timing T6. The write command is used to write the data into the A-port-dedicated memory cell array 705. The command decoder 701 supplies the decoded result to the internal address generating circuit 726 and the control circuit 729. The address latch circuit 702 reads the address signal ColADD that has been entered through the address terminal of the A-port 30. The address latch circuit 702 supplies the address signal ColADD to the internal address generating circuit 726. The internal address generating circuit 726 supplies, based on the decoded result from the command decoder 701, eight column addresses one-by-one at every clock cycle, from the address signal.

The command decoder 701 recognizes the data transfer command so that the command decoder 701 generates the A-read bus control signal and the A-write bus control signal. The command decoder 701 supplies the A-read bus control signal to the output data buffer 710 and the data buffer 724. The command decoder 701 supplies the A-write bus control signal to the input data buffer 711 and the data buffer 724. In accordance with the A-read bus control signal, the output data buffer 710 stops to read the data from the A-read bus 751 and also stops to transfer the data signal to the terminals DQ0a . . . DQ31a belonging to the A-port 30. In accordance with the A-write bus control signal, the input data buffer 711 stops to read the data from terminals DQ0a, . . . DQ31a belonging to the A-port 30 and also stops to transfer the data to the A-write bus 752.

In accordance with the A-read bus control signal and the A-write bus control signal, the data as read out of the shared memory cell array 716 is transferred through the A-read bus 751 to the data buffer 724, so that the data buffer 724 read the data sequentially and supplies the read data to the A-write bus 752.

At a timing T8, the shared memory cell array 716 outputs the data in accordance with the read command that has been entered at the timing T6. The data buffer 724 reads the data that has been transferred through the read data amplifier circuit Damp 718 to the A-read bus 751. The data buffer 724 supplies the read data to the A-write bus 752.

At a timing T9, the write data amplifier circuit Wbuf 709 reads the data that has been transferred onto the A-write bus 752 at the previous clock cycle. Namely, the write data amplifier circuit Wbuf 709 reads the data in accordance with the write command that has been entered at the timing T7. The write data amplifier circuit Wbuf 709 supplies the read data to the A-port-dedicated memory cell array 705. The data buffer 724 reads the data that has been transferred through the A-read bus 751 from the shared memory cell array 716. The data buffer 724 supplies the read data to the A-write bus 752.

Until a timing T13, the eight data are sequentially output from the shared memory cell array 716, and the sequentially read data are input into the A-port-dedicated memory cell array 705. The A-port-dedicated memory cell array 705 stores the eight data that have been stored in the shared memory cell array 716.

The above described processes transfer the data stored in the shared memory cell array 716 to the A-port-dedicated memory cell array 705. The writing operation to write the series data into the A-port-dedicated memory cell array 705 has already started before the read operation to read the series data out of the shared memory cell array 716 is completed. Namely, the sequential read operation is carried out to sequentially read the series data out of the shared memory cell array 716, while the sequential write operation is carried out to sequentially write the sequentially-read-data into the A-port-dedicated memory cell array 705. As illustrated in FIG. 3, data that has previously been read out of the shared memory cell array 716 at one clock cycle is written into the A-port-dedicated memory cell array 705 at the next clock cycle that is next to the one clock cycle, while the next data is read out of the shared memory cell array 716. Starting the writing operation to write the series data into the A-port-dedicated memory cell array 705 before completion of the read operation to read the series data out of the shared memory cell array 716 reduces the number of clock cycles that is necessary for transferring the data stored in the shared memory cell array 716 to the A-port-dedicated memory cell array 705. Writing data that has previously been read out of the shared memory cell array 716 at one clock cycle into the A-port-dedicated memory cell array 705 at the next clock cycle while reading the next data out of the shared memory cell array 716 reduces the number of clock cycles that is necessary for transferring the data stored in the shared memory cell array 716 to the A-port-dedicated memory cell array 705. As the burst length becomes longer, the reduced number of the clock cycles increases. The above-described processes allow efficient data transfer from the shared memory cell array 716 to the A-port-dedicated memory cell array 705.

The above-described processes will be applicable to other data transfer from the A-port-dedicated memory cell array 704 or 705 to the shared memory cell array 716 as well as to still other data transfer between the B-port-dedicated memory cell array 717 and the shared memory cell array 716.

Figure 4:
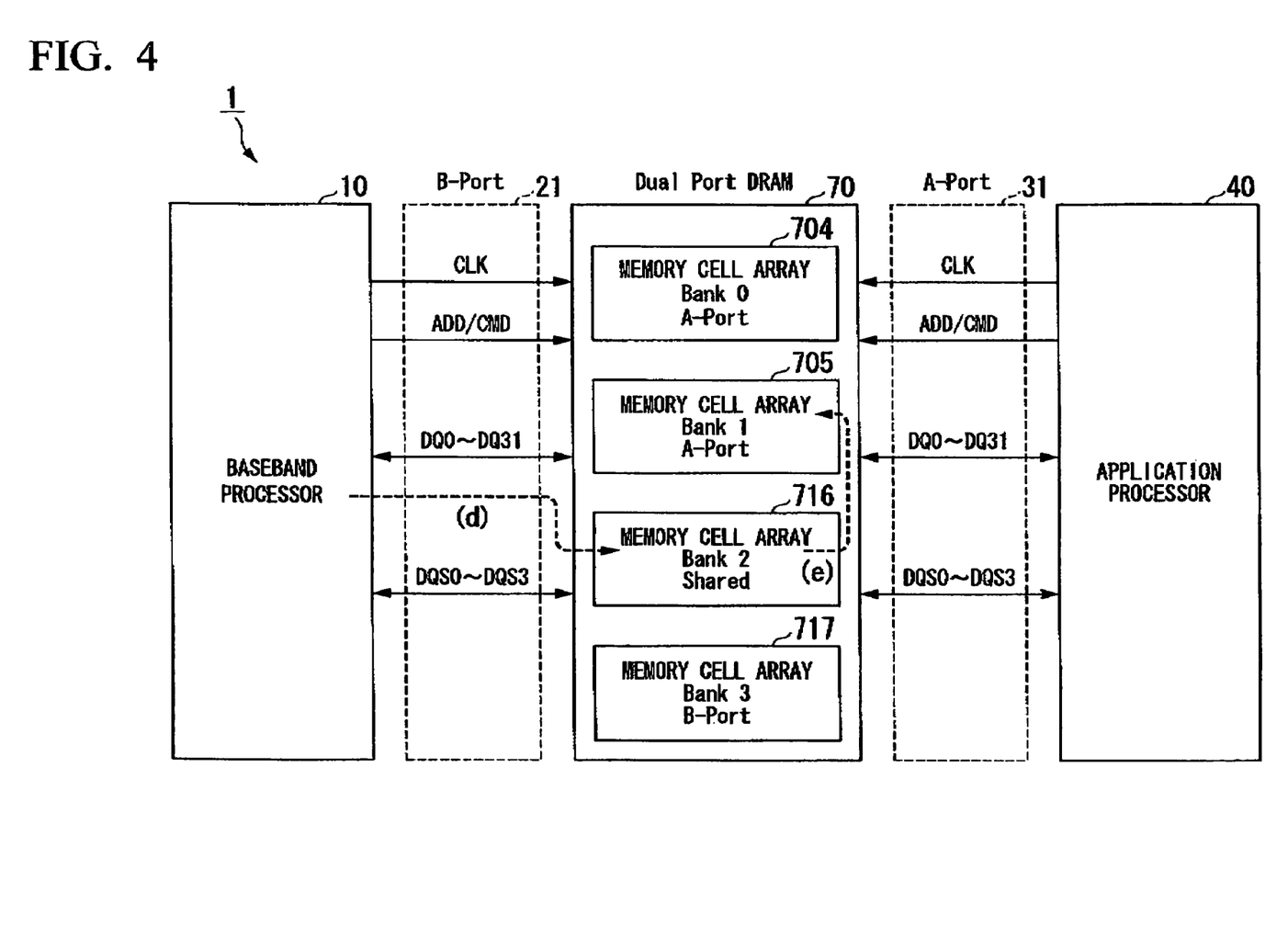
FIG. 4 is a schematic block diagram illustrating a data processing system that includes a dual port DRAM, a baseband processor and an application processor in accordance with the embodiment of the present invention.

FIG. 4 is a schematic block diagram illustrating the data processing system 1 that includes the above-described dual port DRAM 70, the above-described baseband processor 10 and the above-described application processor 40 in accordance with the related art. The dual port DRAM 70 performs as the multi-port DRAM. The dual port DRAM 70 has two ports, for example, the A-port and the B-port. The dual port DRAM 70 is connected through the B-port bus 21 to the baseband processor 10. The dual port DRAM 70 is connected through the A-port bus 31 to the application processor 40. The A-port bus 31 connects between the dual port DRAM 70 and the application processor 40. The B-port bus 21 connects between the dual port DRAM 70 and the baseband processor 10. The dual port DRAM 70 may include, but is not limited to, A-port-dedicated memory cell arrays 704 and 705, the shared memory cell array 716, and the B-port-dedicated memory cell array 717. The dual port DRAM 70 may have, but is not limited to, the A-port 30, and the B-port 20.

FIG. 4 illustrates a data flow of transferring data from the baseband processor 10 to the application processor 40.

In a step (d), the baseband processor 10 supplies data through the B-port bus 21 to the shared memory cell array 716, so that the shared memory cell array 716 stores the data.

In a step (e), the application processor 40 supplies a data transfer command through the A-port bus 31 to the dual port DRAM 70. The dual port DRAM 70 transfers the data from the shared memory cell array 116 to the A-port-dedicated memory cell array 705 in accordance with the data transfer command. As a result, the data is transferred from the baseband processor 10 to the application processor 40. The data transfer from the shared memory cell array 716 to the A-port-dedicated memory cell array 705 starts to be performed before the operation to read out of the shared memory cell array 716 is completed. The data transfer from the shared memory cell array 716 to the A-port-dedicated memory cell array 705 is carried out without temporary storing the data in the application processor 40. The above-described data transfer from the shared memory cell array 716 to the A-port-dedicated memory cell array 705 can reduce the number of clock cycles that is necessary for transferring the data stored in the shared memory cell array 716 to the A-port-dedicated memory cell array 705. The above-described processes allow efficient data transfer from the shared memory cell array 716 to the A-port-dedicated memory cell array 705.

The above-described processes will be applicable to other data transfer from the application processor 40 to the baseband processor 10.

Use of the dual port DRAM 70 configured as described above allows the data processing system 1 to shorten the data-transfer-time as closely to the clock cycles for burst-writing the data. The data-transfer-time is a time that is necessary for data transfer between the baseband processor 10 and the application processor 40. A typical example of the data transfer between the baseband processor 10 and the application processor 40 may include, but is not limited to, transferring data from the shared memory cell array 716 to the A-port-dedicated memory cell array 704 or 705 or to the B-port-dedicated memory cell array 717. Another typical example of the data transfer between the baseband processor 10 and the application processor 40 may include, but is not limited to, transferring data from the A-port-dedicated memory cell array 704 or 705 to the shared memory cell array 716, or from the B-port-dedicated memory cell array 717 to the shared memory cell array 716.

The data transfer command can be constituted by the burst read command and the burst write command. Thus, the protocol to be used in the multi-port DRAM can be available. The protocol for memory control applicable to the data processing system 1 can be available without any protocol change or modification.

The baseband processor 10 is arranged in a data sending side transfers data through the shared memory cell array 716 in the dual port DRAM 70 to the application processor 40. The baseband processor 10 performs such the data transfer without preventing the application processor 40 from accessing the A-port-dedicated memory cell array 704 or 705. The baseband processor 10 is permitted to perform such the data transfer without confirming every time whether or not the application processor 40 is placed in a state that is available to receive the data. This means that the baseband processor 10 is permitted to perform such the data transfer, independently from the state of the application processor 40. These advantages described above can be said in the other case on which data is transferred from the application processor 40 to the baseband processor 10.

The dual port DRAM 70 includes not only the internal address generating circuits 726 and 728 for the A-port 30 and the B-port 20 respectively but also the internal address generating circuit 727 for the shared memory cell array 716. The data transfer through the first one of the A-port 30 and the B-port 20 to the shared memory cell array 716 does not disturb the second one of the A-port 30 and the B-port 20 from accessing the memory cell array.

The data transfer to the shared memory cell array 716 can be carried out without transferring data to the external device. Thus, the external device can perform other processing without waiting for the completion of the data transfer, thereby allowing efficient data processing.

In the foregoing embodiments, the multi-port DRAM is realized by the dual port DRAM 70 that has two ports. The number of the ports of the DRAM should not be limited. The above described configuration and processes of the dual port DRAM 70 can be applicable, in general, to any multi-port DRAM having three or more ports.

A semiconductor memory device can be realized by, but not limited to, the multi-port DRAM that has a plurality of ports. The ports of the multi-port DRAM can be realized by, but not limited to, the A-port 30 and the B-port 20. Each port of the multi-port DRAM may be connected to a processor. The processors connected to the ports of the multi-port DRAM can be realized by, but not limited to, the baseband processor 10 and the application processor 40. The multi-port DRAM may include, but is not limited to, a controller and an internal bus. In some cases, the controller may include, but is not limited to, the command decoders 701 and 713 and the control circuits 729 and 730. In some cases, the internal bus may include, but is not limited to, the A-read bus 751, the A-write bus 752, the B-read bus 753, and the B-write bus 754.

The term "configured" is used to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a plurality of memory cell arrays;
   a plurality of ports;
   a plurality of internal address generating circuits generating first and second internal addresses of first and second memory cell arrays of the plurality of memory cell arrays, the first internal address designating a first area of the first memory cell array, and the second internal address designating a second area of the second memory cell array; and
   a controller that reads a series of data from the first area sequentially and writes the series of read data into the second area sequentially without transferring the series of read data to the plurality of ports.

2. The semiconductor device according to claim 1, wherein the controller starts the operation of writing the series of read data into the second area before the controller completes the operation of reading the series of data from the first area.

3. The semiconductor device according to claim 1, wherein the internal address generating circuit receives a data transfer command including an address signal from the port,
   the plurality of internal address generating circuits generate the first and second internal addresses based on the address signal, and
   the controller reads the series of data from the first area sequentially and writes the series of read data into the second area sequentially in accordance with the data transfer command.

4. The semiconductor device according to claim 1, further comprising:
   an internal bus through which the controller transfers the series of data from the first memory cell array to the second memory cell array.

5. The semiconductor device according to claim 1, wherein the controller writes the read data at a following clock cycle that follows a previous clock cycle at which the controller has read the data.

6. The semiconductor device according to claim 5, wherein the controller writes the read data at a next clock cycle that is next to a previous clock cycle at which the controller has read the data.

7. The semiconductor device according to claim 1, wherein the plurality of ports each have at least one command terminal, at least one address terminal, and at least one data terminal, and the plurality of internal address generating circuits each independently receive the data transfer command from the at least one command terminal and the at least one address terminal.

8. The semiconductor device according to claim 1, wherein the data transfer command comprises a combination of a burst read command and a burst write command, the burst read command and the burst write command are sequentially entered from the at least one command terminal and the at least one address terminal.

9. The semiconductor device according to claim 1, wherein the controller reads the series of data from the first area sequentially in accordance with the burst read command and the controller writes the series of read data into the second area sequentially in accordance with the burst write command.

10. The semiconductor device according to claim 1, wherein the plurality of memory cell arrays comprises:
   a plurality of dedicated memory cell arrays that are each dedicated to a corresponding one of the plurality of ports, the dedicated memory cell array being ascribable to at least one of the plurality of internal address generating circuits; and
   at least one shared memory cell array that is shared by the plurality of ports, the at least one shared memory cell array being accessible to another one of the plurality of internal address generating circuits.

11. The semiconductor device according to claim 10, wherein the controller reads the series of data out of a first one of the plurality of dedicated memory cell arrays and writes the series of read data into the shared memory cell array, and subsequently, the controller reads the series of read data out of the shared memory cell array and writes the series of read data into a second one of the plurality of dedicated memory cell arrays.

12. A semiconductor device comprising:
   a plurality of memory cell arrays;
   a plurality of ports;
   a plurality of internal address generating circuits generating first and second internal addresses of first and second memory cell arrays of the plurality of memory cell arrays, the first internal address designating a first area of the first memory cell array, and the second internal address designating a second area of the second memory cell array; and
   a controller that performs parallel reading and writing operations of reading a series of data from the first area sequentially and writing the series of read data into the second area sequentially, the controller starting the operation of writing the series of read data into the second area before the controller completes the operation of reading the series of data from the first area.

13. The semiconductor device according to claim 12, wherein the internal address generating circuit receives a data transfer command including an address signal from the port,
   the plurality of internal address generating circuits generate the first and second internal addresses based on the address signal, and
   the controller performs the parallel reading and writing operations in accordance with the data transfer command.

14. The semiconductor device according to claim 12, further comprising:
   an internal bus through which the controller transfers the series of data from the first memory cell array to the second memory cell array.

15. The semiconductor device according to claim 12, wherein the plurality of ports each have at least one command terminal, at least one address terminal, and at least one data terminal, and the plurality of internal address generating circuits each independently receive the data transfer command from the at least one command terminal and the at least one address terminal.

16. The semiconductor device according to claim 12, wherein the data transfer command comprises a combination of a burst read command and a burst write command, the burst read command and the burst write command are sequentially entered from the at least one command terminal and the at least one address terminal.

17. The semiconductor device according to claim 12, wherein the controller reads the series of data from the first area sequentially in accordance with the burst read command and the controller writes the series of read data into the second area sequentially in accordance with the burst write command.

18. The semiconductor device according to claim 12, wherein the plurality of memory cell arrays comprises:
   a plurality of dedicated memory cell arrays that are each dedicated to a corresponding one of the plurality of ports, the dedicated memory cell array being ascribable to at least one of the plurality of internal address generating circuits; and
   at least one shared memory cell array that is shared by the plurality of ports, the at least one shared memory cell array being accessible to another one of the plurality of internal address generating circuits.

19. The semiconductor device according to claim 18, wherein the controller reads the series of data out of a first one of the plurality of dedicated memory cell arrays and writes the series of read data into the shared memory cell array, and subsequently, the controller reads the series of read data out of the shared memory cell array and writes the series of read data into a second one of the plurality of dedicated memory cell arrays.

20. A data processing system comprising:
   a plurality of memory cell arrays;
   a plurality of ports;
   a plurality of processors being each coupled to a corresponding one of the plurality of ports;
   a plurality of internal address generating circuits that receive a data transfer command including an address signal through the port from the processor, the internal address generating circuit generating first and second internal addresses of first and second memory cell arrays of the plurality of memory cell arrays, the first internal address designating a first area of the first memory cell array, and the second internal address designating a second area of the second memory cell array; and
   a controller that reads a series of data from the first area sequentially and writes the series of read data into the second area sequentially in accordance with the data transfer command, without transferring the series of read data to the plurality of ports, the controller starting the operation of writing the series of read data into the second area before the controller completes the operation of reading the series of data from the first area.

* * * * *